United States Patent
Wang et al.

(10) Patent No.: US 8,238,394 B2
(45) Date of Patent: Aug. 7, 2012

(54) LOW POWER CONSUMPTION PUMP DRIVING CIRCUIT

(75) Inventors: Jing Wei Wang, Guangdong (CN); Ai Hua Yu, Guangdong (CN)

(73) Assignee: O-Net Communications (Shenzhen) Limited, Shenzhen (CN)

( * ) Notice: Subject to any disclaimer, the term of this patent is extended or adjusted under 35 U.S.C. 154(b) by 30 days.

(21) Appl. No.: 13/054,570

(22) PCT Filed: Mar. 1, 2010

(86) PCT No.: PCT/CN2010/070812
§ 371 (c)(1),
(2), (4) Date: Jan. 18, 2011

(87) PCT Pub. No.: WO2011/054196
PCT Pub. Date: May 12, 2011

(65) Prior Publication Data
US 2011/0211605 A1      Sep. 1, 2011

(30) Foreign Application Priority Data

Nov. 5, 2009   (CA) ...................... 2009 2 0260058 U

(51) Int. Cl.
*H01S 3/00*        (2006.01)
(52) U.S. Cl. ............... 372/38.01; 372/38.02; 372/38.04; 372/38.07; 372/36
(58) Field of Classification Search ............... 372/38.01, 372/38.02, 38.04, 38.07
See application file for complete search history.

(56) References Cited

U.S. PATENT DOCUMENTS 3,751,166 A * 8/1973 Starkey et al. ............... 356/5.04
2004/0245936 A1 * 12/2004 Flower ......................... 315/120

FOREIGN PATENT DOCUMENTS

JP         11-195831        * 7/1999

OTHER PUBLICATIONS

International Search Report of PCT/CN2010/070812.

* cited by examiner

*Primary Examiner* — Dung Nguyen

(57) ABSTRACT

The present patent application provides a low power consumption pump driving circuit including a laser cooling chip, a PMOS transistor, a NMOS transistor, a LC filter circuit, a laser, and a voltage sampling circuit. The pulse width modulating signal generated by the laser cooling chip and the control terminal of the PMOS transistor are connected to the gate of the PMOS transistor. The source of the PMOS transistor is connected to a power supply. The drain of the PMOS transistor is connected to the LC filter circuit. The other terminal of the LC filter circuit is connected to the anode of the laser. The cathode of the laser is connected to the drain of the NMOS transistor. The source of the NMOS transistor is connected to the ground. One terminal of the voltage sampling circuit is connected to the laser. The other terminal of the voltage sampling circuit is connected to the laser cooling chip. The circuit according to the present patent application has only two modes: the saturation active mode and the cutoff mode. When the PMOS and the NMOS are in the saturation active mode, the power consumed by the transistors is negligible. The laser is driven by a DC signal converted through the LC filter circuit, which ensures no power is wasted on the whole serial loop and achieves the requirement of low power consumption.

8 Claims, 1 Drawing Sheet

LOW POWER CONSUMPTION PUMP DRIVING CIRCUIT

FIELD OF THE PATENT APPLICATION

The present patent application relates to a pump driving circuit and particularly to a low power consumption and stable pump driving circuit.

BACKGROUND

Currently, driving circuits of lasers are mostly driven by DC circuits directly. Such a driving circuit usually includes a transistor or MOSFET, a power supply, a laser, and a current limiting resistor connected in series. A transistor D1, a MOSFET, and a current limiting resistor R1 are connected in series and thereby forming the complete branch circuit. Thus, if a voltage Vc is applied to the branch circuit, the total voltage Vc is equal to the sum of the voltage VLD distributed to the transistor D1, the voltage Vmos distributed to the MOSFET, and the voltage VR1 at the current limiting resistor R1. The power supply voltage is distributed over the whole branch circuit. The power supply voltage is mainly 3.3 V or 5 V. The forward driving voltage of the laser is not greater than 2.5 V. As a result, at least 0.8 V or 2.5 V of voltage is distributed to the transistor or the MOSFET 11 and the current limiting resistor R1, thereby causing 24.24% or 50% of the power consumption is wasted respectively.

SUMMARY

The present patent application provides a circuit that controls laser driving based on PWM (Pulse-width Modulation) signals generated by a laser cooling chip and achieves the effect of lowering power consumption with PWM.

To realize the above object, the present patent application provides a low power consumption pump driving circuit including: a laser cooling chip, a PMOS transistor, a NMOS transistor, a LC filter circuit, a laser and a voltage sampling circuit. A pulse width modulating signal generated by the laser cooling chip and a control terminal of the PMOS transistor are connected to the gate of the PMOS transistor. The source of the PMOS transistor is connected to a power supply. The drain of the PMOS transistor is connected to the LC filter circuit. The other terminal of the LC filter circuit is connected to the anode of the laser. The cathode of the laser is connected to the drain of the NMOS transistor. The source of the NMOS transistor is connected to the ground. One terminal of the voltage sampling circuit is connected to the laser. The other terminal of the voltage sampling circuit is connected to the laser cooling chip and configured to provide a laser forward driving voltage to the laser cooling chip. A NMOS control terminal of the laser cooling chip is connected to the gate of the NMOS transistor.

In a preferred embodiment, the other terminal of the LC filter circuit is connected to a high power small resistance resistor, the other terminal of the high power small resistance resistor is connected to the anode of the laser, and the cathode of the laser is connected to the drain of the NMOS transistor.

In a preferred embodiment, the low power consumption pump driving circuit further includes a maximum laser driving voltage setting circuit and a laser driving current setting circuit connected with the laser cooling circuit. The maximum laser driving voltage setting circuit is configured to set a maximum voltage that can be present at the two terminals of the laser and the laser driving current setting circuit is configured to set the DC driving current for the laser.

In a preferred embodiment, the maximum laser driving voltage setting circuit is a potentiometer divider circuit, a digital potentiometer divider circuit, a voltage divider circuit that includes a resistance voltage divider network, or a DAC (digital to analog converter) circuit.

In a preferred embodiment, the laser driving current setting circuit is a potentiometer divider circuit, a digital potentiometer divider circuit, a voltage divider circuit that includes a resistance voltage divider network, or a DAC (digital to analog converter) circuit.

In a preferred embodiment, the laser cooling chip is an ADN8831 chip, an ADN8830 chip, or an LTC1923 chip, which is a laser cooling chip that has the pulse-width modulation capability.

The advantages of the embodiments of the present patent application are the following. The low power consumption pump driving circuit is realized by PWM mode, which is, by adjusting the duty cycle of the pulse signal, respectively controlling the time for saturation active mode and cutoff mode of the PMOS and NMOS transistors. The PMOS and NMOS transistors in the embodiments have only two modes: the saturation active mode and the cutoff mode. When the PMOS and the NMOS are in the saturation active mode, the power consumed by the transistors is negligible. In addition, because the resistance of the high power low resistance resistor is very small, the power consumed by the high power low resistance resistor is also negligible. The laser is driven by a DC signal converted through the LC filter circuit, which ensures no power consumption is wasted on the whole serial loop and achieves the requirement of low power consumption.

BRIEF DESCRIPTIONS OF THE DRAWINGS

DETAILED DESCRIPTION

Further description is made to the present patent application hereafter with the illustration of the drawings.

Figure 1:
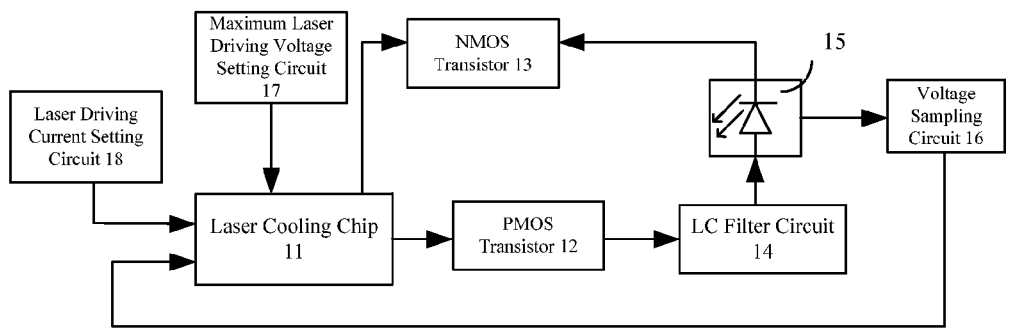
FIG. 1 is a block diagram illustrating the working principle of a low power consumption pump driving circuit in accordance with a first embodiment of the present patent application.

FIG. 1 is a block diagram illustrating the working principle of a low power consumption pump driving circuit in accordance with a first embodiment of the present patent application. Referring to FIG. 1, a low power consumption pump driving circuit 10 includes a laser cooling chip 11, a PMOS transistor 12, a NMOS transistor 13, a LC filter circuit 14, a laser 15, and a voltage sampling circuit 16. The pulse width modulating signal generated by the laser cooling chip 11 and a control terminal of the PMOS transistor are connected to the gate of the PMOS transistor 12. The source of the PMOS transistor 12 is connected to a power supply (not shown in FIG. 1). The drain of the PMOS transistor 12 is connected to the LC filter circuit 14. The other terminal of the LC filter circuit 14 is connected to the anode of the laser 15. The cathode of the laser 15 is connected to the drain of the NMOS transistor 13. The source of the NMOS transistor 13 is connected to the ground. The NMOS control terminal of the laser cooling chip 11 is connected to the gate of the NMOS transistor 13.

The pump driving circuit 10 further includes a maximum laser driving voltage setting circuit 17 and a laser driving current setting circuit 18. The maximum laser driving voltage setting circuit 17 is configured to set a maximum voltage that can be present at the two terminals of the laser. The laser driving current setting circuit 18 is configured to set the DC driving current for the laser.

The maximum laser driving voltage setting circuit 17 may be a potentiometer divider circuit, a digital potentiometer divider circuit, a voltage divider circuit that includes a resistance voltage divider network, or a DAC (digital to analog converter) circuit.

The laser driving current setting circuit 18 may be a potentiometer divider circuit, a digital potentiometer divider circuit, a voltage divider circuit that includes a resistance voltage divider network, or a DAC (digital to analog converter) circuit.

The laser cooling chip 11 is an ADN8831 chip, an ADN8830 chip, or an LTC1923 chip, which is a laser cooling chip that has the pulse-width modulation capability.

The working principle of this embodiment is the following. The low power consumption pump driving circuit is realized with pulse width modulation (PWM). A voltage V2 of the laser driving current setting circuit 18 is input to the laser cooling chip 11. V2 is in linear relationship with the laser current that needs to be set:

$$V2 = K \times I2$$

I2 is an expected laser current value. K is the slope of the linear relationship and can be determined by the designer according the actual requirements. The voltage V2 of the maximum laser driving voltage setting circuit 17 outputs a PWM signal through the internal control processing of the laser cooling chip 11 so as to adjust the duty cycle of the pulse signal, i.e., to adjust the DC driving current of the laser 15. The voltage sampling circuit 16 amplifies the forward voltage drop V3 of the laser 15 by a certain factor A2 into the voltage V4 and feeds the voltage V4 back to the laser cooling chip 11. The above-mentioned forward voltage drop V3 is a voltage drop on the laser. A2 is the amplification factor of the voltage sampling circuit 16. V4 is the output voltage of the voltage sampling circuit. The amplification factor A2 of the voltage sampling circuit 16 is given by the linear relationship between the driving current of the laser and the forward voltage of the laser in the test report of the laser. Because the linear relationship between the driving current of each laser 15 and the forward voltage of the laser is different, such linear relationship is different. The voltage fed back from the voltage sampling circuit 16 to the laser cooling chip 11 is compared with the voltage of the laser driving current setting circuit. When the two voltages are different, the laser cooling chip will continue to adjust the duty cycle of the pulse signal till the voltage of the laser driving current setting circuit 18 is equal to the voltage of the voltage sampling circuit 16, so as to realize the function of setting the laser current, thereby ensuring almost no power consumption is wasted over the whole serial loop and achieving the requirement of low power consumption.

Figure 2:
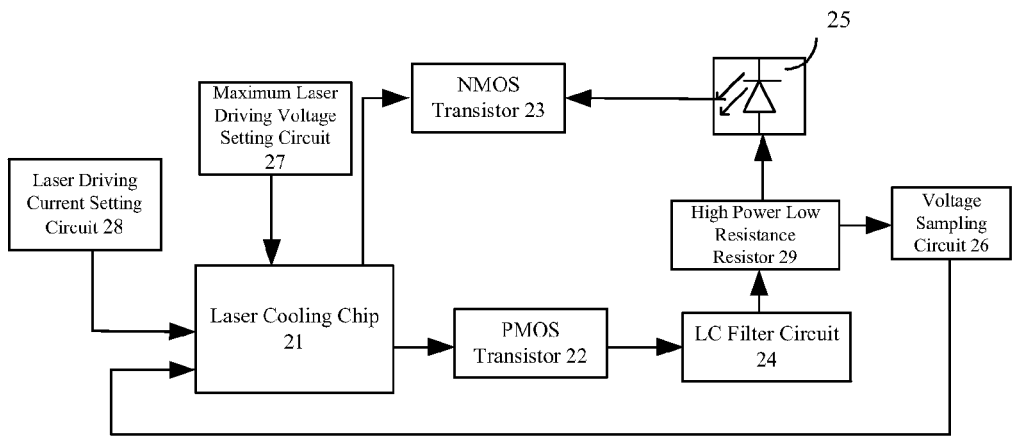
FIG. 2 is a block diagram illustrating the working principle of a low power consumption pump driving circuit in accordance with a second embodiment of the present patent application.

FIG. 2 is a block diagram illustrating the working principle of a low power consumption pump driving circuit in accordance with a second embodiment of the present patent application. Referring to FIG. 2, a low power consumption pump driving circuit 20 includes a laser cooling chip 21, a PMOS transistor 22, a NMOS transistor 23, a LC filter circuit 24, a laser 25, and a voltage sampling circuit 26. The pulse width modulating signal generated by the laser cooling chip 21 and the control terminal of the PMOS transistor are connected to the gate of the PMOS transistor 22. The source of the PMOS transistor 22 is connected to a power supply (not shown in FIG. 2). The drain of the PMOS transistor 22 is connected to the LC filter circuit 24. The other terminal of the LC filter circuit 24 is connected to the anode of the laser 25. The cathode of the laser 25 is connected to the drain of the NMOS transistor 23. The source of the NMOS transistor 23 is connected to the ground. The NMOS control terminal of the laser cooling chip 21 is connected to the gate of the NMOS transistor 23.

The pump driving circuit 20 further includes a maximum laser driving voltage setting circuit 27 and a laser driving current setting circuit 28. The maximum laser driving voltage setting circuit 27 is configured to set a maximum voltage that can be present at the two terminals of the laser. The laser driving current setting circuit 28 is configured to set the DC driving current for the laser. The pump driving circuit 20 further includes a high power small resistance resistor 29. The voltage sampling circuit 26 provides the voltage on the high power small resistance resistor 29 to the laser cooling chip 21, and forms feedback control with the laser driving current setting circuit of the laser 25.

The maximum laser driving voltage setting circuit 27 may be a potentiometer divider circuit, a digital potentiometer divider circuit, a voltage divider circuit that includes a resistance voltage divider network, or a DAC (digital to analog converter) circuit.

The laser driving current setting circuit 28 may be a potentiometer divider circuit, a digital potentiometer divider circuit, a voltage divider circuit that includes a resistance voltage divider network, or a DAC (digital to analog converter) circuit.

The laser cooling chip 21 is an ADN8831 chip, an ADN8830 chip, or an LTC1923 chip, which is a laser cooling chip that has the pulse width modulation capability.

The working principle of this embodiment is the following. The voltage sampling circuit 26 amplifies the voltage V1 on the high power low resistance resistor by a certain factor A1 and outputs the voltage V5 to the laser cooling chip 21. The above-mentioned V1 is the voltage on the high power low resistance resistor and complies with Ohm's law:

$$V1 = R1 \times I1$$

I1 is the actual current value of the current on the high power low resistance resistor 19. R1 is the resistance value of the high power low resistance resistor 19. V5 is the output voltage of the voltage sampling circuit. With the amplification factor A1, the following formula gives:

$$V2 = V5 = V1 \times A1$$

The voltage fed back from the voltage sampling circuit 26 to the laser cooling chip 21 is compared with the voltage of the laser driving current setting circuit for the laser 25. When the two voltages are different, the laser cooling chip will continue to adjust the duty cycle of the pulse signal till the voltage of the laser driving current setting circuit 28 is equal to the voltage of the voltage sampling circuit 26, so as to realize the function of setting the laser current.

The maximum laser driving voltage setting circuit, according to the data set of the laser cooling chip (for example an ADN8831 chip), directly gives:

$$V7 = V8 \times 5$$

V7 is the maximum value of the laser driving voltage. V8 is the voltage output by the maximum laser driving voltage setting circuit.

Thus, because the resistance of the high power low resistance resistor 19 is very small, the power consumed by the high power low resistance resistor is negligible. A DC signal converted through the LC filter circuit 24 is used to drive the laser, which ensures almost no power consumption is wasted over the whole serial loop and achieves the requirement of low power consumption.

The advantages of the embodiments of the present patent application are the following. The low power consumption pump driving circuit is realized by PWM mode, which is, by adjusting the duty cycle of the pulse signal, respectively controlling the time for saturation active mode and cutoff mode of the PMOS and NMOS transistors. The PMOS and NMOS transistors in the embodiments have only two modes: the saturation active mode and the cutoff mode. When the PMOS and the NMOS are in the saturation active mode, the power consumed by the transistors is negligible. In addition, because the resistance of the high power low resistance resistor is very small, the power consumed by the high power low resistance resistor is also negligible. The laser is driven by a DC signal converted through the LC filter circuit, which ensures no power consumption is wasted on the whole serial loop and achieves the requirement of low power consumption.

While the present patent application has been shown and described with particular references to a number of embodiments thereof, it should be noted that various other changes or modifications may be made without departing from the scope of the present invention.

What is claimed is:

1. A low power consumption pump driving circuit comprising:
   a laser cooling chip;
   a PMOS transistor;
   a NMOS transistor;
   a LC filter circuit;
   a laser; and
   a voltage sampling circuit;
   wherein a pulse width modulating signal generated by the laser cooling chip and a control terminal of the PMOS transistor are connected to the gate of the PMOS transistor;
   the source of the PMOS transistor is connected to a power supply;
   the drain of the PMOS transistor is connected to the LC filter circuit;
   the cathode of the laser is connected to the drain of the NMOS transistor;
   the source of the NMOS transistor is connected to the ground; and
   a NMOS control terminal of the laser cooling chip is connected to the gate of the NMOS transistor;
   wherein the pump driving circuit further comprises a high power small resistance resistor, the other terminal of the LC filter circuit is connected to a high power small resistance resistor, the other terminal of the high power small resistance resistor is connected to the anode of the laser, the voltage sampling circuit provides the voltage on the high power small resistance resistor to the laser cooling chip, and forms feedback control with the laser driving current setting circuit of the laser;
   the pump driving circuit further comprises a maximum laser driving voltage setting circuit and a laser driving current setting circuit connected with the laser cooling circuit, wherein the maximum laser driving voltage setting circuit is configured to set a maximum voltage that can be present at the two terminals of the laser and the laser driving current setting circuit is configured to set the DC driving current for the laser;
   the maximum laser driving voltage setting circuit is a potentiometer divider circuit, a digital potentiometer divider circuit, a voltage divider circuit that includes a resistance voltage divider network, or a DAC (digital to analog converter) circuit;
   the laser driving current setting circuit is a potentiometer divider circuit, a digital potentiometer divider circuit, a voltage divider circuit that includes a resistance voltage divider network, or a DAC (digital to analog converter) circuit.

2. A low power consumption pump driving circuit comprising:
   a laser cooling chip;
   a PMOS transistor;
   a NMOS transistor;
   a LC filter circuit;
   a laser; and
   a voltage sampling circuit;
   wherein a pulse width modulating signal generated by the laser cooling chip and a control terminal of the PMOS transistor are connected to the gate of the PMOS transistor;
   the source of the PMOS transistor is connected to a power supply;
   the drain of the PMOS transistor is connected to the LC filter circuit;
   the other terminal of the LC filter circuit is connected to the anode of the laser;
   the cathode of the laser is connected to the drain of the NMOS transistor;
   the source of the NMOS transistor is connected to the ground;
   one terminal of the voltage sampling circuit is connected to the laser;
   the other terminal of the voltage sampling circuit is connected to the laser cooling chip and configured to provide a laser forward driving voltage to the laser cooling chip; and
   a NMOS control terminal of the laser cooling chip is connected to the gate of the NMOS transistor;
   the pump driving circuit further comprises a maximum laser driving voltage setting circuit and a laser driving current setting circuit connected with the laser cooling circuit, wherein the maximum laser driving voltage setting circuit is configured to set a maximum voltage that can be present at the two terminals of the laser and the laser driving current setting circuit is configured to set the DC driving current for the laser;
   the maximum laser driving voltage setting circuit is a potentiometer divider circuit, a digital potentiometer divider circuit, a voltage divider circuit that includes a resistance voltage divider network, or a DAC (digital to analog converter) circuit;
   the laser driving current setting circuit is a potentiometer divider circuit, a digital potentiometer divider circuit, a voltage divider circuit that includes a resistance voltage divider network, or a DAC (digital to analog converter) circuit.

3. A low power consumption pump driving circuit comprising:
   a laser cooling chip;
   a PMOS transistor;
   a NMOS transistor;
   a LC filter circuit;
   a laser; and a voltage sampling circuit;
wherein a pulse width modulating signal generated by the laser cooling chip and a control terminal of the PMOS transistor are connected to the gate of the PMOS transistor;

the source of the PMOS transistor is connected to a power supply;

the drain of the PMOS transistor is connected to the LC filter circuit;

the other terminal of the LC filter circuit is coupled to the anode of the laser;

the cathode of the laser is connected to the drain of the NMOS transistor;

the source of the NMOS transistor is connected to the ground;

one terminal of the voltage sampling circuit is connected to the laser;

the other terminal of the voltage sampling circuit is coupled to the laser cooling chip and configured to provide a laser forward driving voltage to the laser cooling chip; and a NMOS control terminal of the laser cooling chip is connected to the gate of the NMOS transistor.

4. The low power consumption pump driving circuit of claim 3, wherein the other terminal of the LC filter circuit is connected to a high power small resistance resistor, the other terminal of the high power small resistance resistor is connected to the anode of the laser, and the cathode of the laser is connected to the drain of the NMOS transistor.

5. The low power consumption pump driving circuit of claim 3 further comprises a maximum laser driving voltage setting circuit and a laser driving current setting circuit connected with the laser cooling circuit, wherein the maximum laser driving voltage setting circuit is configured to set a maximum voltage that can be present at the two terminals of the laser and the laser driving current setting circuit is configured to set the DC driving current for the laser.

6. The low power consumption pump driving circuit of claim 5, wherein the maximum laser driving voltage setting circuit is a potentiometer divider circuit, a digital potentiometer divider circuit, a voltage divider circuit that includes a resistance voltage divider network, or a DAC (digital to analog converter) circuit.

7. The low power consumption pump driving circuit of claim 5, wherein the laser driving current setting circuit is a potentiometer divider circuit, a digital potentiometer divider circuit, a voltage divider circuit that includes a resistance voltage divider network, or a DAC (digital to analog converter) circuit.

8. The low power consumption pump driving circuit of claim 3, wherein the laser cooling chip is an ADN8831 chip, an ADN8830 chip, or an LTC1923 chip, which is a laser cooling chip that has the pulse-width modulation capability.

* * * * *